(12) United States Patent
Monden et al.

(10) Patent No.: US 7,688,109 B2
(45) Date of Patent: Mar. 30, 2010

(54) SEMICONDUCTOR MEMORY DEVICE

(75) Inventors: Junji Monden, Kanagawa (JP); Naoichi Kawaguchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/155,908

(22) Filed: Jun. 11, 2008

(65) Prior Publication Data

US 2008/0309372 A1    Dec. 18, 2008

(30) Foreign Application Priority Data

Jun. 18, 2007    (JP)    ............... 2007-160025

(51) Int. Cl.
  *H03K 19/00*    (2006.01)
  *H03K 19/02*    (2006.01)
(52) U.S. Cl. ............... 326/56; 326/37; 326/82
(58) Field of Classification Search ........ None
  See application file for complete search history.

(56) References Cited

U.S. PATENT DOCUMENTS 6,593,646 B2 *    7/2003    Callahan ............... 257/686
7,236,423 B2    6/2007    Sohn et al.
2003/0211679 A1 *    11/2003    Kim et al. ............... 438/200

FOREIGN PATENT DOCUMENTS

| JP | 05-210577 | 8/1993 |
| JP | 2003-007963 A | 1/2003 |
| JP | 2006-172700 A | 6/2006 |

* cited by examiner

*Primary Examiner*—Anh Q Tran
(74) *Attorney, Agent, or Firm*—Foley & Lardner LLP (57) ABSTRACT

The object of the present invention is to appropriately constitute such a semiconductor integrated circuit that mounts a plurality of semiconductor chips thereon so as to increase storage capacity. A semiconductor chip, including: a chip enable buffer circuit which outputs a chip enable signal in response to an output command of the chip enable signal; a standard chip enable pad which receives the output command; a first extension pad which supplies a first extension chip enable signal to the chip enable buffer circuit; a second extension pad which supplies a second extension chip enable signal to the chip enable buffer circuit; a first option pad which receives a first option signal; and a second option pad which receives a second option signal, is constituted.

19 Claims, 9 Drawing Sheets

SEMICONDUCTOR MEMORY DEVICE

This application claims priority to Japanese Application No. 2007-160025, filed Jun. 18, 2007, the disclosure of which is hereby incorporated by reference.

BACKGROUND OF THE INVENTION

1. Field of the Invention

The present invention relates to a semiconductor memory device.

2. Description of the Related Art

Most of currently available semiconductor integrated circuits are constructed as an IC package. System performance of some semiconductor integrated circuits mounted on the IC package depends on its storage capacity. Preferably, such semiconductor integrated circuits are designed to have the same packaging specification and memory function and variable storage capacity so that they can be mounted on a same substrate. Thus, a semiconductor integrated circuit enabling the storage capacity of a system to be changed depending on demanded system performance is constituted.

As a technology for constituting semiconductor integrated circuits having semiconductor chips with the same packaging specification and memory function and different storage capacity, a technology for stacking and mounting a plurality of semiconductor chips in one package is known. Such a technology has been applied, for example, to a case in which large storage capacity is intended by stacking a plurality of semiconductor memory chips.

In some semiconductor integrated circuits in which a plurality of semiconductor chips are stacked, terminals of a package for sending/receiving an input signal such as an address signal or a control signal are shared among a plurality of the chips. Moreover, in some of them, an I/O terminal for inputting/outputting data is shared among a plurality of the semiconductor chips. When the I/O terminal is shared, it is preferable that reading/writing of data is performed for a desired chip by selecting each of the chips separately. In such a case, each of the chips is selected by using a chip selection signal which is generally referred to as a chip enable signal/CE. A technology regarding a semiconductor integrated circuit has been known, in which a chip enable terminal is shared among a plurality of chips and each of the chips can be selected by an address signal (refer to, for example, Japanese Patent Laid-Open No. 2003-7963 and Japanese Patent Laid-Open No. 2006-172700).

Figure 1:
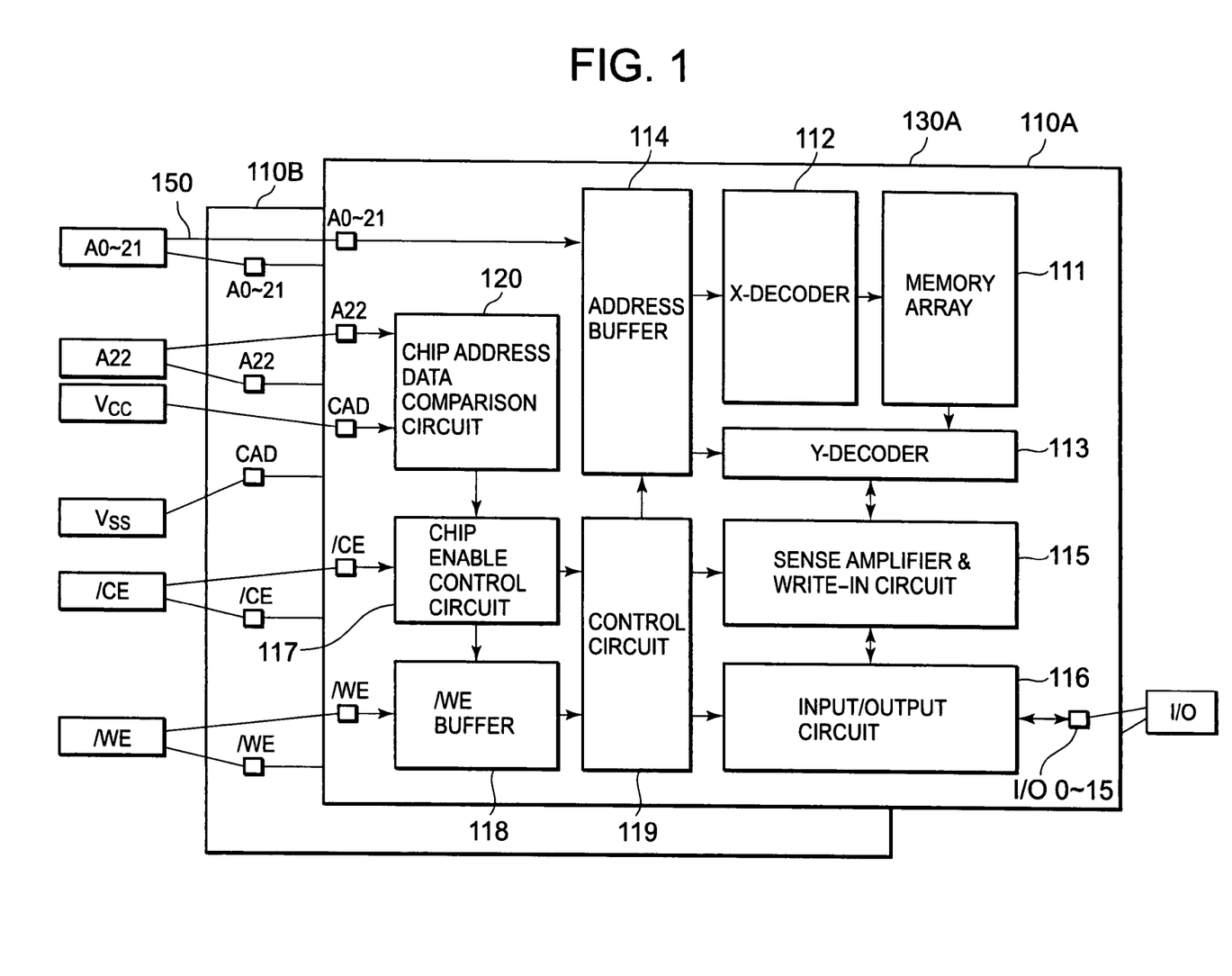
FIG. 1 is a block diagram illustrating a configuration of a known semiconductor device.

In Japanese Patent Laid-Open No. 2003-7963, a technology regarding a multi-chip stack type semiconductor memory device is disclosed, in which a chip enable terminal is shared by a plurality of chips and each of chips can be selected by an address signal. FIG. 1 is a block diagram illustrating the configuration of a semiconductor device described in Japanese Patent Laid-Open No. 2003-7963. In the semiconductor device described in Japanese Patent Laid-Open No. 2003-7963, memory chips 110A and 110B are stacked. As illustrated in FIG. 1, each of the memory chips 110A and 110B is constituted by including an memory array 111, an X decoder 112, a Y decoder 113, an address buffer 114, a sense amplifier & write-in circuit 115, an input/output circuit 116, a chip enable control circuit 117, an input buffer 118, a control circuit 119, and an address bits comparison circuit 120.

In the memory array 111, a plurality of memory cells arranged in a matrix are included. The X-decoder 112 decodes an input X-based address and causes one word line in the memory array 111 to be in a selection level. The Y decoder 113 decodes an input Y-based address and selects a corresponding bit line in the memory array 111. The address buffer 114 takes in the input X-based address and Y-based address and supplies them to the X decoder 112 and the Y decoder 113. The sense amplifier & write-in circuit 115 amplifies a signal read out in the selected bit line or provides the electric potential to the bit line to the signal depending on write-in data. The input/output circuit 116 outputs the read-out data or takes in the write-in data from outside the chip. The chip enable control circuit 117 takes in a chip enable signal/CE input from the outside of the chip to generate an internal control signal. The input buffer 118 takes in external control signals such as a write enable signal/WE, a reset signal RES, and an out enable signal/OE. The control circuit 119 generates a control signal of the inside of the chip depending on a taken-in control signal to control the inside.

The semiconductor chips 110A and 110B described in Japanese Patent Laid-Open No. 2003-7963 are provided with a chip address CAD, respectively. The address bits comparison circuit 120 causes the chip enable control circuit 117 to be enabled depending on the electric potential applied to the chip address CAD and the most significant bit of a plurality of the address signals supplied from the outside of the chip. For example, the address bits comparison circuit 120 causes the chip enable control circuit 117 to be enabled depending on the most significant bit A22 of address signals A0 to A22 (such as 23 bits), and the electric potential applied to the chip address CAD. One of the chip address CAD of the semiconductor chip 110A and the chip address CAD of the semiconductor chip 110B is connected to a first power-supply-voltage terminal VCC of the package and the other of them is connected to a second power-supply-voltage terminal VSS of the package.

Figure 2A:
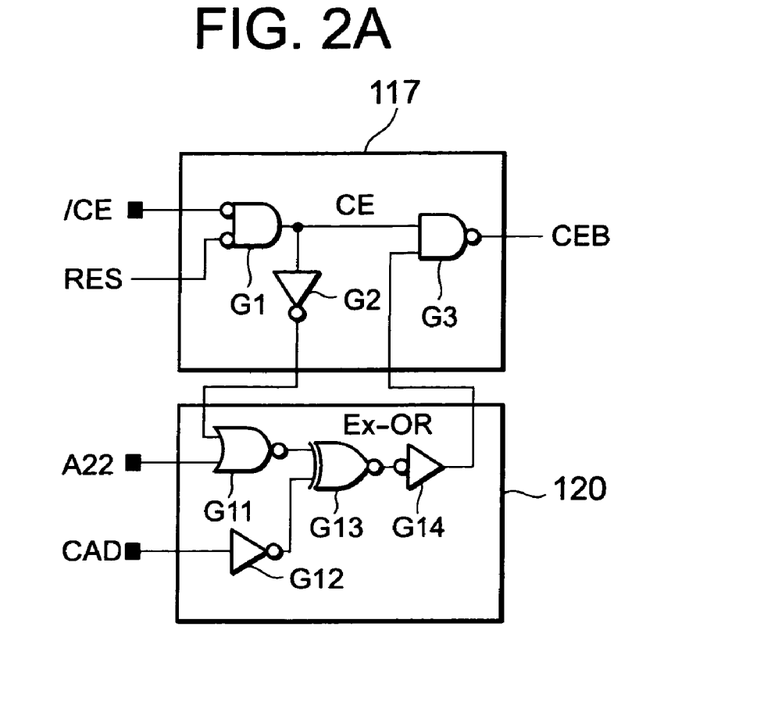
FIG. 2A is a circuit diagram illustrating a configuration of a chip enable control circuit 117 and an address bits comparison circuit 120.

FIG. 2A is a circuit diagram illustrating the configuration of the chip enable control circuit 117 and the address bits comparison circuit 120. The chip enable control circuit 117 is constituted by including an AND gate G1, an inverter G2, and a NAND gate G3. The AND gate G1 uses the chip enable signal/CE, and the reset signal RES as the input thereof. The inverter G2 reverses the output of the AND gate G1, and supplies it to the address bits comparison circuit 120. The NAND gate G3 generates an internal chip enable signal CEB based on the output signal of the AND gate G1, and the signal from the address bits comparison circuit 120.

Figure 2B:
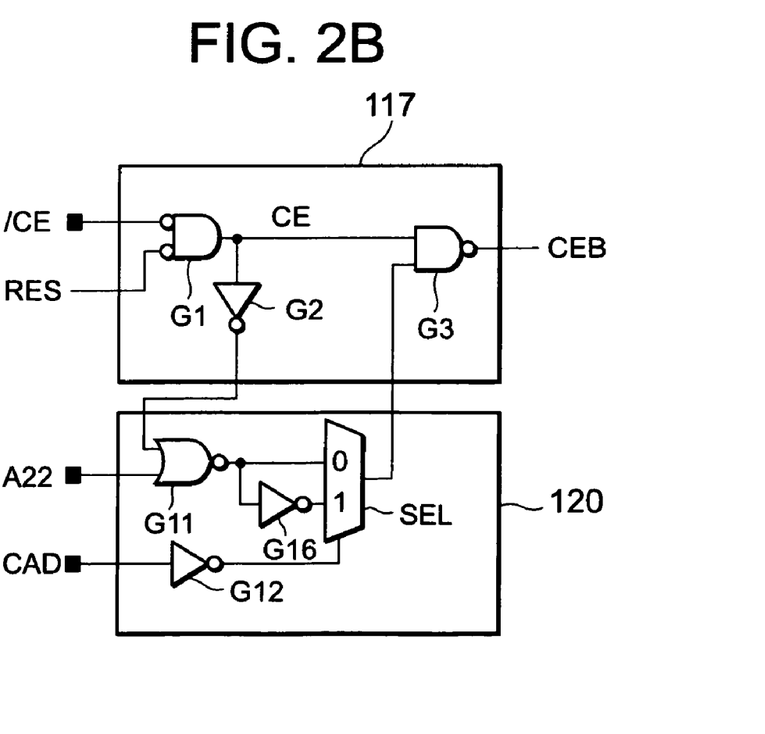
FIG. 2B is a circuit diagram illustrating another configuration of the chip enable control circuit 117 and the address bits comparison circuit 120.

The address bits comparison circuit 120 is constituted by including a first NOR gate G11, a second inverter G12, an Exclusive-OR gate 13, and a third inverter G14. The first NOR gate G11 uses the output signal and the address most significant bit A22 of the inverter G2 of the chip enable control circuit 117 as the input thereof. The second inverter G12 generates a signal corresponding to the electric potential applied to the chip address CAD. The Exclusive-OR gate G13 uses the output signals of the second inverter G12 and the first NOR gate G11 as the inputs thereof. The third inverter G14 reverses the output of the Exclusive-OR gate G13, and supplies it to the NAND gate G3 of the chip enable control circuit 117. FIG. 2B is a circuit diagram illustrating another configuration of the chip enable control circuit 117 and the address bits comparison circuit 120. As illustrated in FIG. 2B, the circuit having the other configuration is provided with an selector SEL, instead of the Exclusive-OR gate G13, and constituted so as to control the selector SEL with the output of the second inverter G12 which generates a signal depending on the electric potential applied to the chip address CAD. These circuits causes the internal chip enable signal CEB to be in a chip selection state or a non selection state, depending on the electric potential applied to the address most significant bit A22 and the chip address CAD.

In the technology described in Japanese Patent Laid-Open No. 2003-7963, the chip address CAD is input into the chip address data comparison circuit 120 connected to an extension address (A24). The address bits comparison circuit 120 compares the chip address CAD and the address most significant bit A22, and determines to select the chip address CAD if they coincide with each other and determines not to select the chip address CAD if they do not coincide with each other. More specifically, when the chip address CAD has the same electric potential as that of the second power supply voltage VCC, the chip address data comparison circuit 120 will have a positive chip enable function, and when the chip address CAD has the same electric potential as that of the first power supply voltage VSS, the chip address data comparison circuit 120 will have a negative chip enable function. When chips are stacked together, by changing levels given to the chip address CAD in each of the upper and lower chips, the two memory chips are operated as one memory chip having two times of storage capacity.

Figure 3:
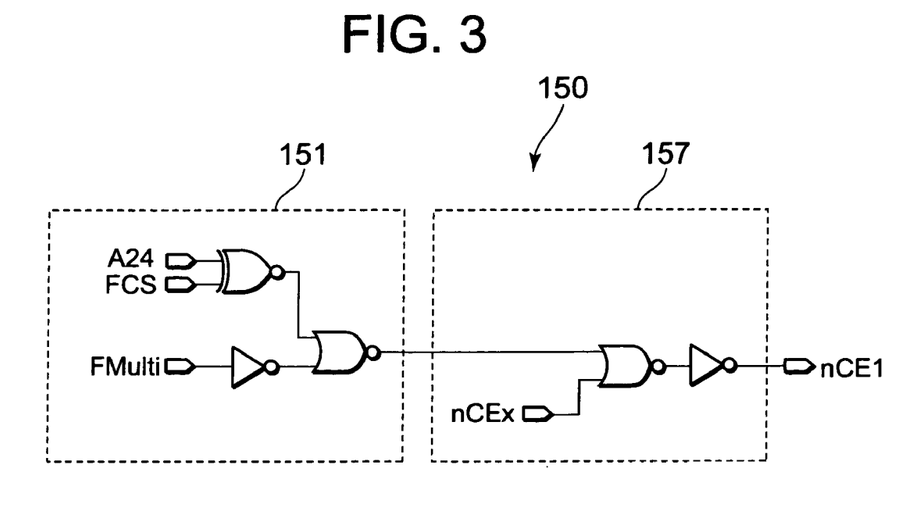
FIG. 3 is a circuit diagram illustrating a configuration of a known chip enable buffer.

Moreover, in Japanese Patent Laid-Open No. 2006-172700, a technology regarding a low electric power multi-chip semiconductor memory device and a chip enable method thereof are disclosed. FIG. 3 is a circuit diagram illustrating the configuration of a chip enable buffer 150 of the semiconductor memory device described in Japanese Patent Laid-Open No. 2006-172700. The chip enable buffer 150 is constituted by including a chip selection section 151 and a signal generation section 157. The chip selection section 151 compares an address A24 input from outside and identification information FCS of chips. After that, in response to the comparison result and mode information of two semiconductor chips, the chip selection section 151 selects one of the semiconductor chips 1. The signal generation section 157, in response to a chip enable signal input from outside, generates an internal chip enable signal nCE1 or nCE2 activated by the selected chip.

Further, other than the above mentioned related technologies, a technology regarding a chip selection terminal provided for selecting any chip among a plurality of semiconductor element chips has been known (refer to, for example, Japanese Patent Laid-Open No. 05-210577). In Japanese Patent Laid-Open No. 05-210577, an internal logic designation circuit in which each one of a pair of chip selection terminals (cs/cs, in Japanese Patent Laid-Open No. 05-210577) has a complementary logic value, is constituted at the time of designing semiconductor element chips. In addition, a technology for connecting only one of a pair of the chip selection terminals to an external input end, is described.

As illustrated in FIG. 2A or FIG. 2B, in the technology described in Japanese Patent Laid-Open No. 2003-7963, in order to compare the levels of the most significant bit A22 and the chip address CAD, the address bits comparison circuit 120 is provided with an EX-OR or a selector (SEL). Therefore, the circuit configuration of the address bits comparison circuit 120 becomes complicated, and circuit delay time also becomes large. Moreover, as illustrated in FIG. 3, the technology described in Japanese Patent Laid-Open No. 2006-172700, the extension address (A24) and the EX-OR of a chip identification signal (FCS) are provided as chip enable buffer. Therefore, the circuit configuration of the chip enable buffer 150 becomes complicated, and circuit delay time also becomes large.

Moreover, in the technology described in Japanese Patent Laid-Open No. 05-210577, an input pad is clamped to VCC or GND inside a chip. Therefore, in a pair of positive and negative chip selection terminals, the positive chip selection terminal is clamped to VDD and the negative chip selection terminal is clamped to GND. Therefore, when an input is caused to be in a standby state, pin leak may flow.

Moreover, for a general purpose memory if it is a low storage capacity product requiring no pin, the extension address pin is defined as an NC pin. When the memory chip described in Japanese Patent Laid-Open No. 2003-7963 or Japanese Patent Laid-Open No. 2006-172700 is assembled with one chip, in order to hide the function of an extension address, it is necessary to connect both of the address most significant bit A22 and the chip address CAD to VSS or VCC. Therefore, for the memory chip described in Japanese Patent Laid-Open No. 2003-7963 or Japanese Patent Laid-Open No. 2006-172700, when it is assembled into a one-chip configuration package using a lead frame, the pin to be the expansion address will not be in an NC (no connection) state, but have the first power supply voltage VSS or the second power supply voltage VCC. By this, in some cases, the compatibility of the IC package may be lost.

Hereinafter, using reference numerals used in [DETAILED DESCRIPTION OF THE PREFERRED EMBODIMENTS], means for solving problems will be described. These numbers are given for clarifying the correspondence relationship between the description in [What is claimed is:] and the description in [DETAILED DESCRIPTION OF THE PREFERRED EMBODIMENTS]. However, these numbers may not be used for interpretation of the technical scope of the invention described in [What is claimed is:].

SUMMARY OF THE INVENTION

In order to solve the above-mentioned problems, a semiconductor chip (1), including: a chip enable buffer circuit (2) which outputs a chip enable signal (CEB) in response to an output command (/CE) of the chip enable signal (CEB); a standard chip enable pad (7) which receives the output command (/CE); a first extension pad (5) which supplies a first extension chip enable signal(/CEm+1) to the chip enable buffer circuit (2); a second extension pad (6) which supplies a second extension chip enable signal(CEm+1) to the chip enable buffer circuit (2); a first option pad (4) which receives a first option signal (OP1); and a second option pad (8) which receives a second option signal (OP2), is constructed.

When chips are stacked and assembled, the extension address is connected with a positive side chip enable pad or a negative side chip enable pad. By this, chip selection is performed. Moreover, when the positive side chip enable pad is connected to the extension address, the negative side chip enable pad is caused to be in a selection state. For this reason, option pads are arranged at positions being connectable to an external VSS terminal or VCC terminal. In case of being in a continuous selection state, they are connected to the pads by means of bonding.

When assembling is performed by one chip, the extension address is not connected by means of bonding. In order to cause the two of the positive and negative chip enable buffers to be in a continuous selection state, two option pads are connected to the VSS terminal and the VCC terminal, respectively.

According to the present invention, a semiconductor chip applicable to such a semiconductor integrated circuit on which a plurality of semiconductor chips are mounted and the storage capacity thereof is increased, can be appropriately constructed.

BRIEF DESCRIPTION OF THE DRAWINGS

FIG: 5 is a circuit diagram exemplifying a configuration of a chip enable buffer circuit 2.

DETAILED DESCRIPTION OF THE PREFERRED EMBODIMENTS

First Embodiment

Hereinafter, with reference to drawings, modes for implementing the present invention will be described. A semiconductor chip 1 of the present embodiment includes a chip enable terminal. In some cases, the chip enable terminal (for, example, a standard chip enable pad 7) of a semiconductor chip is disclosed to users as a product specification. Moreover, in some cases, on a semiconductor chip, m (m: an arbitrary integer) kinds of chip enable terminals are constructed, and the product specifications thereof are disclosed.

The semiconductor chip 1 of the present embodiment further includes a pair of a positive and a negative chip enable input terminals (a first expansion chip enable pad 5 and a second expansion chip enable pad 6), other than the disclosed chip enable terminal. It is preferable for the first expansion chip enable pad 5 and the second expansion chip enable pad 6 not to be disclosed. In a below described embodiment, for ease of understanding of the present invention, description will be made corresponding to a case in which one chip enable terminal (a standard chip enable pad 7) disclosed as a product specification is present.

Figure 4:
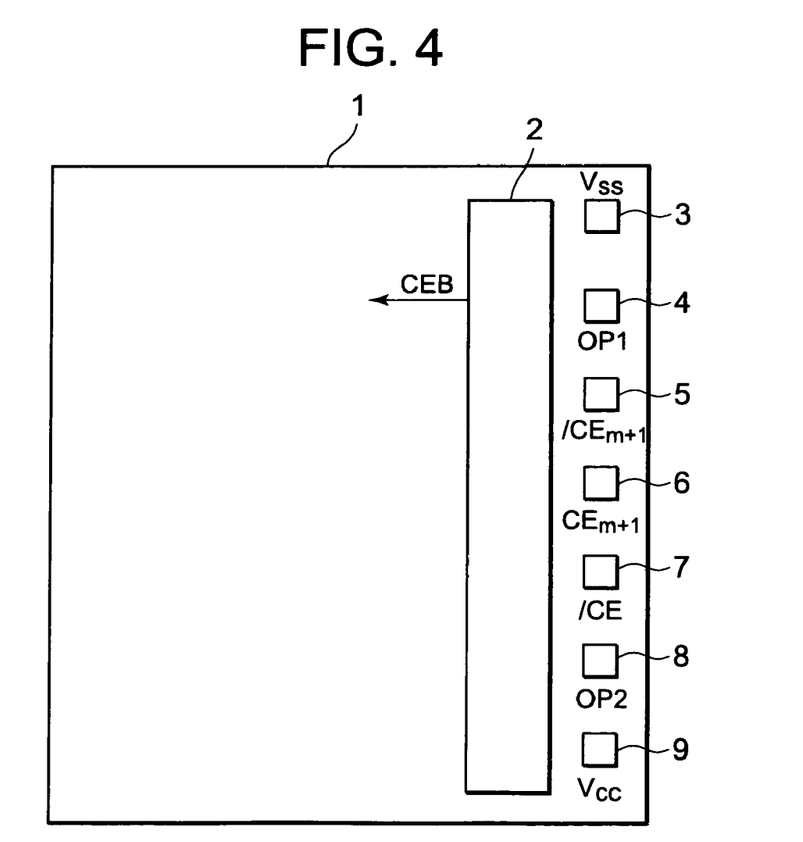
FIG. 4 is a block diagram exemplifying a configuration of a semiconductor chip 1.

FIG. 4 is a block diagram exemplifying the configuration of semiconductor chip 1 of the present embodiment. Referring to FIG. 4, the semiconductor chip 1 of the present embodiment is constituted by including a chip enable buffer circuit 2 and a plurality of pads (first power-supply-voltage supply pad 3 to second power-supply-voltage supply pad 9). The chip enable buffer circuit 2 is provided to the semiconductor chip 1 of the present embodiment. The chip enable buffer circuit 2 outputs an internal chip enable signal CEB.

The first power-supply-voltage supply pad 3 is connectable to a lead frame which supplies the first power supply voltage VSS to the inside of the semiconductor chip 1. Moreover, the first power-supply-voltage supply pad 3 supplies the first power supply voltage VSS to the chip enable buffer circuit 2. The first option pad 4 can be connected to the lead frame which supplies a first option signal OP1. The first option pad 4 supplies the first option signal OP1 to the chip enable buffer circuit 2. The first extension chip enable pad 5 can be connected to the lead frame which supplies a first extension chip enable signal /CEm+1. The first extension chip enable pad 5 supplies the first extension chip enable signal /CEm+1 to the chip enable buffer circuit 2. The second extension chip enable pad 6 can be connected to the lead frame which supplies a second extension chip enable signal CEm+1. The second extension chip enable pad 6 supplies the second extension chip enable signal CEm+1 to the chip enable buffer circuit 2.

The standard chip enable pad 7 can be connected to the lead frame which supplies a chip enable signal output command /CE. The standard chip enable pad 7 supplies a chip enable signal output command /CE to the chip enable buffer circuit 2. The second option pad 8 can be connected to the lead frame which supplies the second option signal OP2. The second option pad 8 supplies the second option signal OP2 to the chip enable buffer circuit 2. The second power-supply-voltage supply pad 9 is connectable to the lead frame which supplies the first power supply voltage VSS to the inside of the semiconductor chip 1. Moreover, the second power-supply-voltage supply pad 9 supplies the second power supply voltage VCC to the chip enable buffer circuit 2.

The chip enable signal output command /CE is a signal which indicates that a semiconductor chip to be the selection target among a plurality of the semiconductor chips is caused to be in a selection state. Moreover, a write enabling signal /WE which is not illustrated in the figure, is a signal which indicates that the semiconductor chip to be the selection target among a plurality of the semiconductor chips is caused to be in a write-in state. Moreover, a reset signal RES which is not illustrated in the figure, is a signal with which the semiconductor chip to be the selection target among a plurality of the semiconductor chips causes the inside thereof to be in a reset state. Moreover, an out enable signal /OE which is not illustrated in the figure, is a signal which indicates that the read-out data signal of the semiconductor chip to be the selection target among a plurality of the semiconductor chips is in a state to be output.

Among the pads into which the control signal and the address signal are input, with regard to pads other than the first option pad 4, the first extension chip enable pad 5, the second extension chip enable pad 6, and the second option pad 8, when a plurality of semiconductor chips are mounted on a package, pads corresponding to each other are commonly connected to a corresponding electrode terminal provided in the package with bonding wires. Moreover, data inputting pads of each of the chips are also commonly connected to a corresponding electrode terminal provided in the package.

Figure 5:
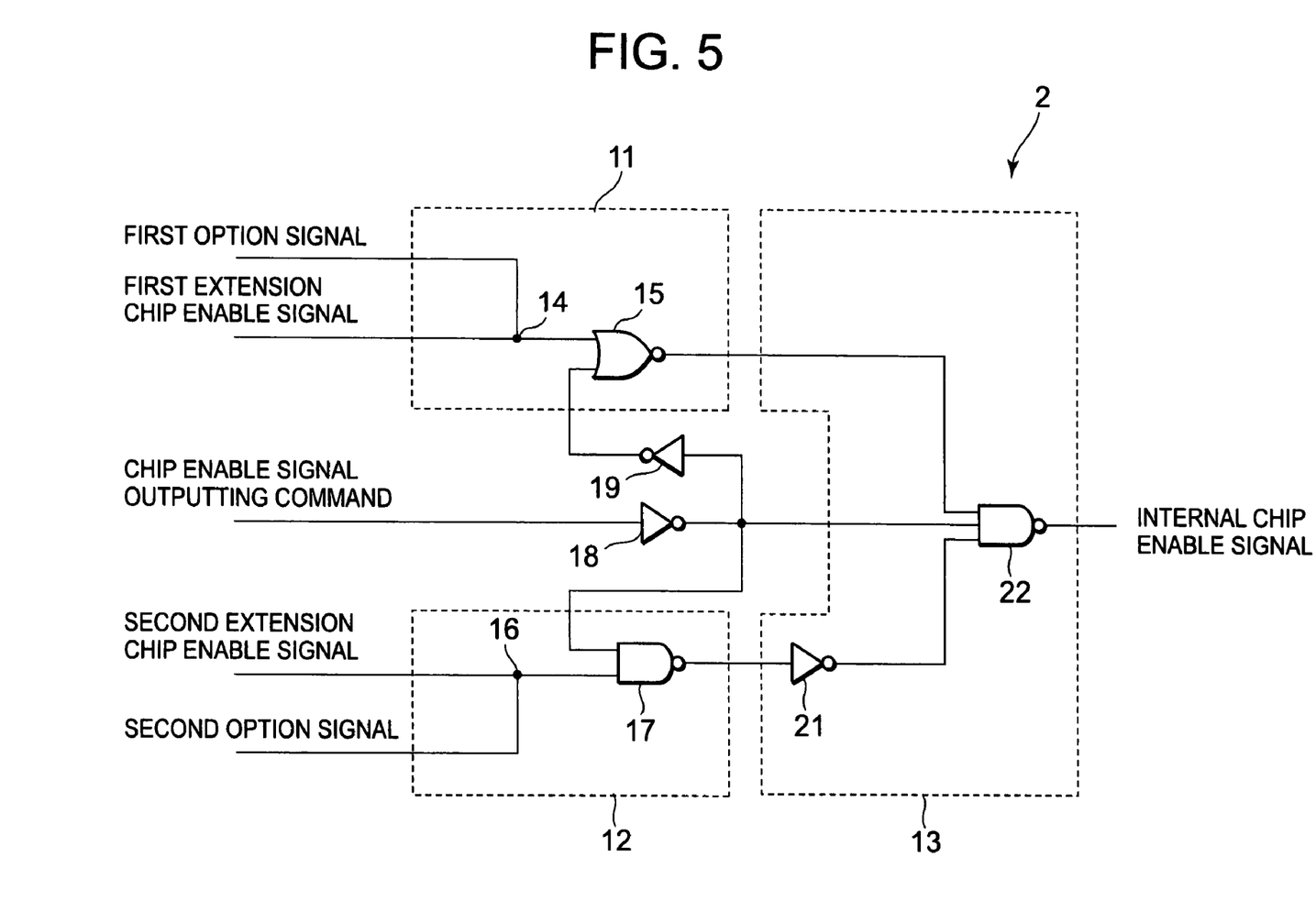

FIG. 5 is a circuit diagram exemplifying the configuration of the chip enable buffer circuit 2. The chip enable buffer circuit 2 is constituted by including a first selection signal generation section 11, a second selection signal generation section 12, a chip enable signal generation section 13, a first inverter 18, and a second inverter 19. The first selection signal generation section 11 is constituted so that it can receive the first option signal OP1 and the first extension chip enable signal /CEm+1. Moreover, the first selection signal generation section 11 is constituted so to be capable of receiving a signal based on the chip enable signal output command /CE. The second selection signal generation section 12 is constituted so as to be capable of receiving the second option signal OP2 and the second extension chip enable signal CEm+1.

Moreover, the second selection signal generation section 12 is constituted so that it can receive a signal based on the chip enable signal output command /CE.

That is to say, the first option signal OP1 and the first extension chip enable signal /CEm+1 are short-circuited by the input thereof. Similarly, the second option signal OP2 and the second extension chip enable signal CEm+1 are short-circuited by the input thereof. In other words, it means that two pads are provided for one input.

The input end of the first inverter 18 is connected to the standard chip enable pad 7. The output end of the first inverter 18 is connected to the input end of the second inverter 19, the second selection signal generation section 12, and the chip enable signal generation section 13. The first inverter 18 supplies a signal that is made by reversing the chip enable signal output command /CE, to the second inverter 19, the second selection signal generation section 12, and the chip enable signal generation section 13. The second inverter 19 further reverses the signal that is made by reversing the chip enable signal output command /CE, and supplies the resultant signal to the first selection signal generation section 11.

The chip enable signal generation section 13, in response to the outputs of the first selection signal generation section 11, the second selection signal generation section 12, and the first inverter 18 (a signal based on the chip enable signal output command /CE), outputs the internal chip enable signal CEB.

Referring to FIG. 5, the first selection signal generation section 11 of the present embodiment is constituted by including a first node 14 and a NOR circuit 15. The NOR circuit 15 is provided with two input ends (a first input end, a second input end). The first node 14 supplies the first option signal OP1 input from the first option pad 4 to the first input end of the NOR circuit 15. Moreover, the first node 14 supplies the first extension chip enable signal /CEm+1 input from the first extension chip enable pad 5 to the first input end of the NOR circuit 15. To the second input end of the NOR circuit 15, a signal that is made by reversing the chip enable signal output command /CE twice using the first inverter 18 and the second inverter 19, is supplied.

Moreover, the second selection signal generation section 12 of the present embodiment is constituted by including a second node 16 and a NAND circuit 17. The NAND circuit 17 is provided with two input ends (a first input end, a second input end). The second node 16 supplies the second option signal OP2 input from the second option pad 8 to the first input end of the NAND circuit 17. Moreover, the second node 16 supplies the second extension chip enable signal CEm+1 input from the second extension chip enable pad 6 to the first input end of the NAND circuit 17. The chip enable signal output command /CE is supplied to the second input end of the NAND circuit 17.

The chip enable signal generation section 13 is constituted by including a CEB output stage inverter 21 and a CEB output stage NAND circuit 22. The CEB output stage NAND circuit 22 is provided with three input ends. A first input end of CEB output stage NAND circuit 22 is connected to the output end of the NOR circuit 15. A second input end of the CEB output stage NAND circuit 22 is connected to the output end of the first inverter 18. A third input end of the CEB output stage NAND circuit 22 is connected to the output end of the NAND circuit 17 through the CEB output stage inverter 21.

Figure 6:
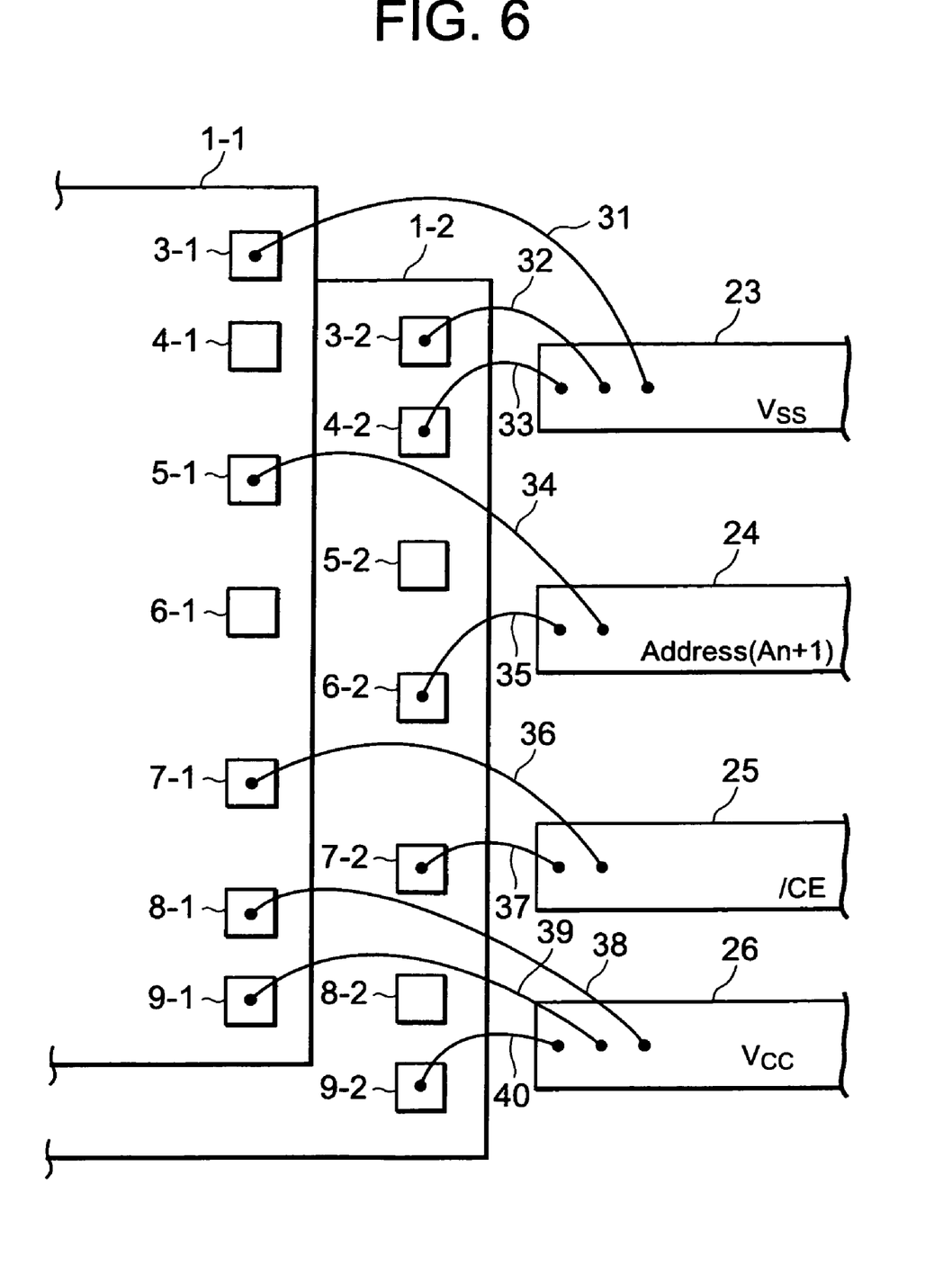
FIG. 6 is a block diagram exemplifying a configuration when two semiconductor chips 1 are stacked.

FIG. 6 is a block diagram exemplifying connection between pads and lead frames when two of the semiconductor chips 1 of the present embodiment are stacked. Hereinafter, by denoting the upper side of the semiconductor chip 1 as a first semiconductor chip 1-1 and the lower side of the semiconductor chip 1 as a second semiconductor chip 1-2, the present embodiment will be described. Moreover, reference numerals indicating a plurality of pads arranged on the first semiconductor chip 1-1 are added with "1" behind a hyphen as branch numbers (for example, a first chip side first power-supply-voltage supply pad 3-1). Similarly, reference numerals indicating a plurality of pads arranged on the second semiconductor chip 1-2 are added with "2" behind a hyphen as branch numbers (for example, a second chip side first power-supply-voltage supply pad 3-2).

In FIG. 6, the connection capable of selecting the first semiconductor chip 1-1 and the second semiconductor chip 1-2, is exemplified. In a semiconductor device including the first semiconductor chip 1-1 and the second semiconductor chip 1-2, when a Low level signal is supplied from a second lead frame 24, the first semiconductor chip 1-1 is selected. Moreover, when a High level signal is supplied from the second lead frame 24, the second semiconductor chip 1-2 is selected. In this case, the first chip side first power-supply-voltage supply pad 3-1 is connected to a first lead frame 23 through a bonding wire 31. A first chip side first extension chip enable pad 5-1 is connected to the second lead frame 24 through a bonding wire 34. A first chip side standard chip enable pad 7-1 is connected to a third lead frame 25 through a bonding wire 36. A first chip side second option pad 8-1 is connected to a fourth lead frame 26 through a bonding wire 38. A first chip side second power-supply-voltage pad 9-1 is connected to the fourth lead frame 26 through a bonding wire 39.

Moreover, a second chip side first power-supply-voltage supply pad 3-2 is connected to the first lead frame 23 through a bonding wire 32, and a second chip side first option pad 4-2 is connected to the first lead frame 23 through a bonding wire 33. A second chip side the second extension chip enable pad 6-2 is connected to the second lead frame 24 through a bonding wire 35. A second chip side standard chip enable pad 7-2 is connected to the third lead frame 25 through a bonding wire 37. A second chip side the second power-supply-voltage supply pad 9-2 is connected to the fourth lead frame 26 through a bonding wire 40.

As illustrated in FIG. 6, a first chip side first option pad 4-1 of the first semiconductor chip 1-1 is connected to no lead frame. Moreover, a first chip side second extension chip enable pad 6-1 is also connected to no lead frame. At this time, in the chip enable buffer circuit 2 of the first semiconductor chip 1-1, the first extension chip enable signal /CEm+1 is supplied to the NOR circuit 15 of the first selection signal generation section 11 through the first chip side first extension chip enable pad 5-1. Moreover, the NAND circuit 17 of the second selection signal generation section 12 is connected to the first chip side second option pad 8-1, to which the second power supply voltage VCC is supplied. When a Low level signal is supplied from the second lead frame 24, in the first semiconductor chip 1-1, the chip enable buffer circuit 2, in response to the chip enable signal output command /CE, outputs the internal chip enable signal CEB while switching activation/non-activation thereof. When a High level signal is supplied from the second lead frame 24, the chip enable buffer circuit 2 of the first semiconductor chip 1-1 always outputs a High level internal chip enable signal CEB, without depending on the chip enable signal output command /CE.

A second chip side first extension chip enable pad 5-2 is connected to no lead frame. Moreover, a second chip side second option pad 8-2 is also connected to no lead frame. At this time, in the chip enable buffer circuit 2 of the second semiconductor chip 1-2, the first power supply voltage VSS is supplied to the NOR circuit 15 of the first selection signal generation section 11 through the second chip side first option pad 4-2. Moreover, the second extension chip enable signal CEm+1 is supplied to the NAND circuit 17 of the second selection signal generation section 12 through a second chip side second extension chip enable pad 6-2. When a High level signal is supplied from the second lead frame 24, in the second semiconductor chip 1-2, in response to the chip enable signal output command /CE, the chip enable buffer circuit 2 outputs the internal chip enable signal CEB by switching activation/non-activation thereof. When a Low level signal is supplied from the second lead frame 24, the chip enable buffer circuit 2 of the second semiconductor chip 1-2 always outputs a High level internal chip enable signal CEB, without depending on the chip enable signal output command /CE.

Figure 7:
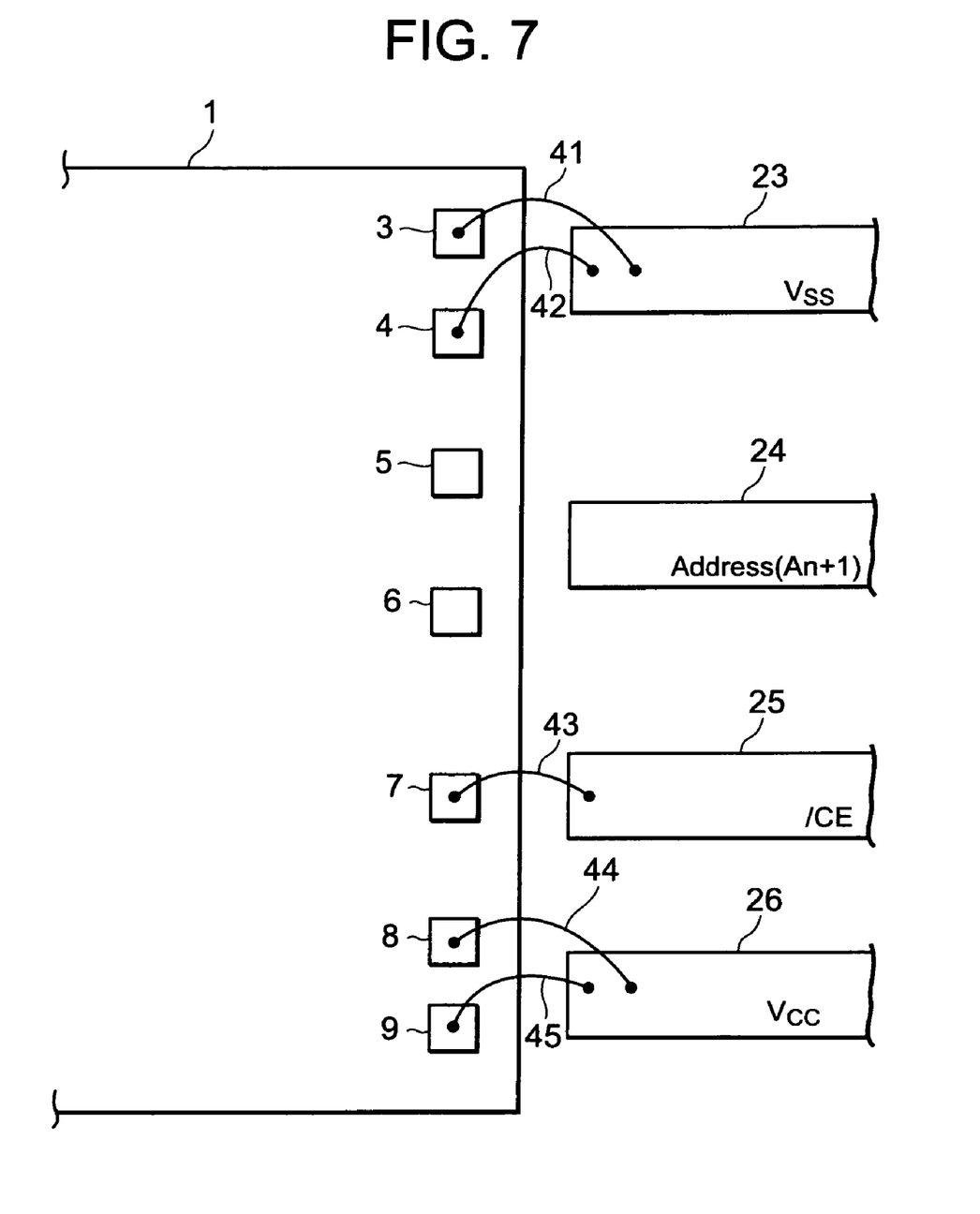
FIG. 7 is a block diagram exemplifying a configuration when single semiconductor chip 1 is mounted.

FIG. 7 is a block diagram exemplifying connection between pads and lead frames when a single semiconductor chip 1 is mounted on a package. A first power-supply-voltage supply pad 3 is connected to the first lead frame 23 through a bonding wire 41. A first option pad 4 is connected to the first lead frame 23 through a bonding wire 42. A standard chip enable pad 7 is connected to the third lead frame 25 through a bonding wire 43. A second option pad 8 is connected to the fourth lead frame 26 through a bonding wire 44. A second power-supply-voltage supply pad 9 is connected to the fourth lead frame 26 through a bonding wire 45.

As illustrated in FIG. 7, when single semiconductor chip 1 is present in a package, a first extension chip enable pad 5 and a second extension chip enable pad 6 are connected to no lead frame. In this case, in the first selection signal generation section 11 of the chip enable buffer circuit 2, the NOR circuit 15 is connected to the first lead frame 23 through the first option pad 4. Moreover, the NAND circuit 17 of the second selection signal generation section 12 is connected to the fourth lead frame 26 through the second option pad 8. At this -time, to the first selection signal generation section 11 of the chip enable buffer circuit 2, the first power supply voltage VSS from the first lead frame 23 is supplied. Moreover, to the NAND circuit 17 of the second selection signal generation section 12, the second power supply voltage VCC from the fourth lead frame 26 is supplied. This enables the chip enable buffer circuit 2, in response to the chip enable signal output command /CE, to output the internal chip enable signal CEB.

Figure 8:
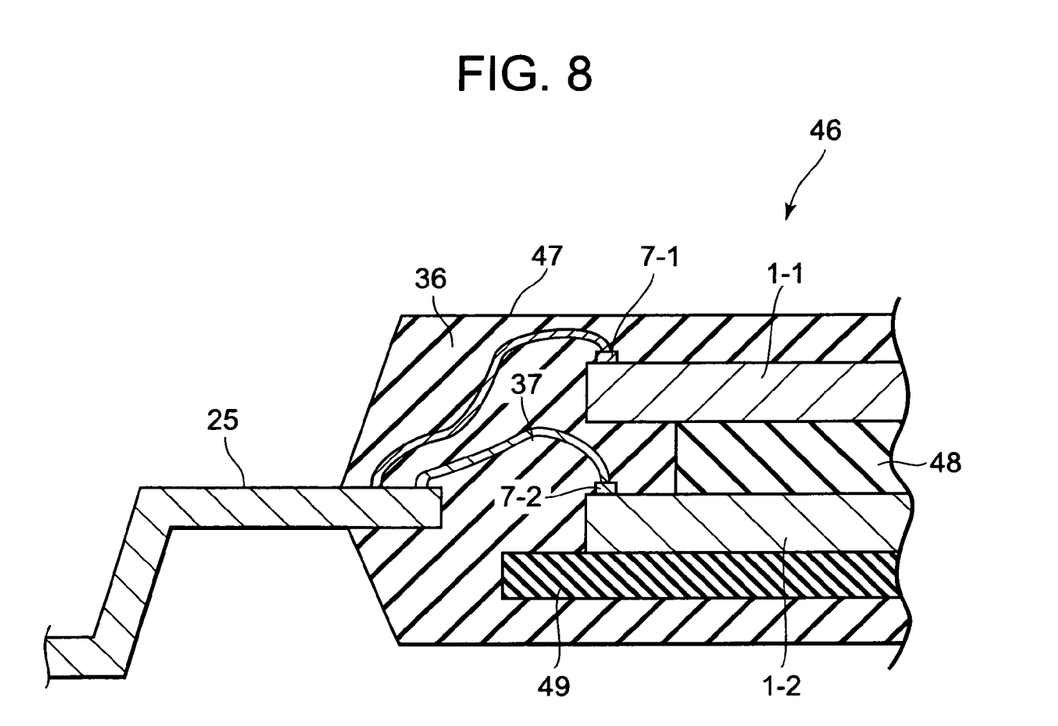
FIG. 8 is a cross-sectional view exemplifying a configuration when two semiconductor chips 1 are stacked.

FIG. 8 is a cross-sectional view exemplifying the configuration when the semiconductor chip 1 of the present embodiment is mounted on an IC package 46 with lead frames, such as a QFP (Quad Flat Package). FIG. 8 exemplifies a cross-section containing the first chip side standard chip enable pad 7-1, the second chip side standard chip enable pad 7-2, and the third lead frame 25, in FIG. 6 mentioned above. The IC package 46 is constituted by including a package 47 and lead frames (for example, the third lead frame 25). The first semiconductor chip 1-1 and the second semiconductor chip 1-2 are mounted on the package 47. Between the first semiconductor chip 1-1 and the second semiconductor chip 1-2, a spacer 48 made of a Si substrate is constituted. In other words, the first semiconductor chip 1-1 and the second semiconductor chip 1-2 are constituted on an island (stage) 49 inside the package 47 in a state in which the first semiconductor chip 1-1 and the second semiconductor chip 1-2 are stacked with intervening the spacer 48.

The two chips (the first semiconductor chip 1-1 and the second semiconductor chip 1-2) are stacked so that the same terminals (for example, the standard chip enable pad 7) thereof are caused to locate the same upper and lower positions. Pads other than the first extension chip enable pad 5 which receives the second extension chip enable signal CEm+1, the second extension chip enable pad 6 which receives the first extension chip enable signal /CEm+1, the first option pad 4 which receives the first option signal OP1, and the second option pad 8 which receives the second option signal OP2, are connected to the same common lead (for example, the third lead frame 25). As mentioned above, by constituting a multi chip package in which two (or greater than two) memory chips are stacked, a memory product with two (or more than two) times of storage capacity can be achieved.

As mentioned above, in order to achieve large storage capacity, the semiconductor chip of the present embodiment is applied to a semiconductor integrated circuit on which a plurality of semiconductor chips are mounted. Therefore, increasing of circuit scale of the chip enable buffer circuit 2 can be suppressed. Moreover, by constituting a chip enable buffer circuits 2 as mentioned above, the pads of a semiconductor chip and lead frames are connected appropriately. Thus, compatibility between an IC package on which a plurality of the semiconductor chips are mounted, and an IC package on which single semiconductor chip is mounted, can be kept.

When the semiconductor chip described in Japanese Patent Laid-Open No. 05-210577 mentioned-above is applied to a product, such as a Low Power SRAM, which has standby current of a 1 µA order, in some times, the pin leak current thereof may be larger rather than the standby current. In the semiconductor chip of the present embodiment, even when the second extension chip enable signal CEm+1, and the first extension chip enable signal /CEm+1 will be in no connection state, logic is established by the action of the first option pad 4 and the second option pad 8. Therefore, flow of the pin leak current is suppressed.

Second Embodiment

Figure 9:
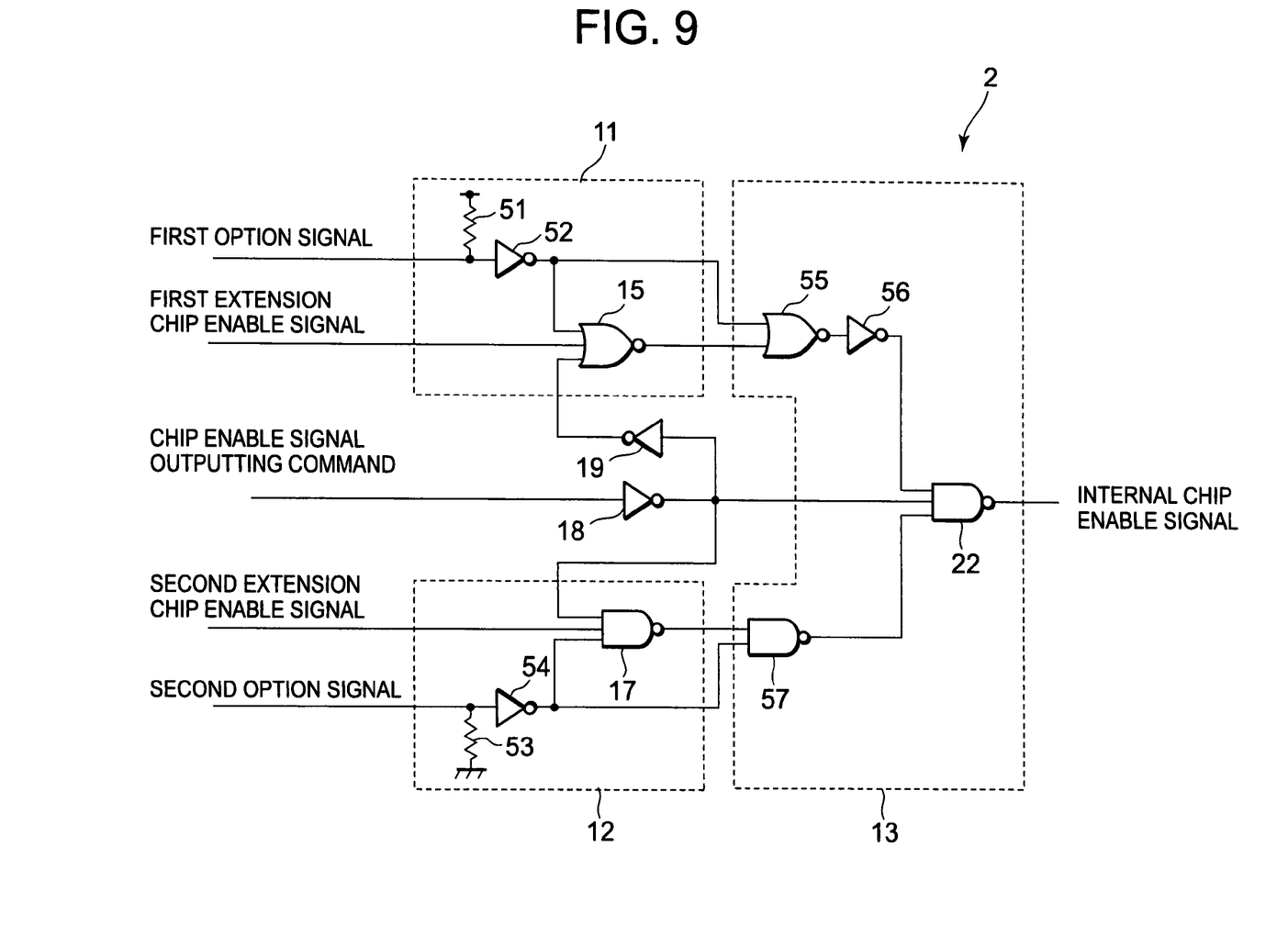
FIG. 9 is a circuit diagram exemplifying a configuration of a chip enable buffer circuit 2 of a second embodiment.

Hereinafter, with reference to a drawing, the second embodiment of the present invention will be described. FIG. 9 is a circuit diagram exemplifying the configuration of a chip enable buffer circuit 2 according a second embodiment of the present invention. The chip enable buffer circuit 2 of the second embodiment is constituted without short-circuiting pads. In the chip enable buffer circuit 2 of the second embodiment, signals from the first option signal OP1 and the second option signal OP2 are taken into first input stage circuits (a first selection signal generation section 11 and a second selection signal generation section 12) of a first extension chip enable signal /CEm+1 and a second extension chip enable signal CEm+1, respectively.

Referring to FIG. 9, a first selection signal generation section 11 of the chip enable buffer circuit 2 according to the second embodiment is constituted by including: a first resistor 51, a third inverter 52, and a NOR circuit 15. The input end of the third inverter 52 is connected to a first option pad 4 which receives the first option signal OP1. Moreover, the input end of the third inverter 52 is connected to a power supply wire through the first resistor 51. The output end of the third inverter 52 is connected to the input end of the NOR circuit 15. The first selection signal generation section 11 supplies a signal output from the NOR circuit 15, and a signal output from the third inverter 52 to a chip enable signal generation section 13.

A second selection signal generation section 12 is constituted by including: a second resistor 53, a fourth inverter 54, and a NAND circuit 17. The input end of the fourth inverter 54 is connected to a second option pad 8 which receives the second option signal OP2. Moreover, the input end of the fourth inverter 54 is connected to a ground line through the second resistor 53. The output end of the fourth inverter 54 is connected to the input end of the NAND circuit 17. The second selection signal generation section 12 supplies a signal output from the second resistor 53, and a signal output from the NAND circuit 17 to the chip enable signal generation section 13.

The chip enable signal generation section 13 is constituted by including a NOR circuit 55, an inverter circuit 56, a NAND circuit 57, and a CEB output stage NAND circuit 22. The NOR circuit 55 is provided with two input ends. The input ends thereof are connected to the output end of the third inverter 52 and the output end of the NOR circuit 15, respectively. The output end of the NOR circuit 55 is connected to the input end of the inverter circuit 56. The NOR circuit 55, in response to the output signal of the NOR circuit 15 supplied from the first selection signal generation section 11, and the output signal of the third inverter 52, supplies the operation results thereof to the inverter circuit 56. The inverter circuit 56 reverses the output signal of the NOR circuit 55, and supplies the resultant signal to the CEB output stage NAND circuit 22.

The NAND circuit 57 is provided with two input ends. The input ends are connected to the output end of the fourth inverter 54 and the output end of the NAND circuit 17, respectively. The output end of the NAND circuit 57 is connected to the CEB output stage NAND circuit 22. The NAND circuit 57, in response to the output signal of the fourth inverter 54 and the output signal of the NAND circuit 17, supplies the operation results thereof to the CEB output stage NAND circuit 22.

The CEB output stage NAND circuit 22, in response the signal output from a first inverter 18, the signal output from the inverter circuit 56, and the signal output from the NAND circuit 57, outputs an internal chip enable signal CEB. As illustrates in FIG. 9, the chip enable buffer circuit 2 of the second embodiment will not generate pass-through current, even if pads (a first extension chip enable pad 5 and a second extension chip enable pad 6) which receives the first extension chip enable signal /CEm+1 and the second extension chip enable signal CEm+1, respectively, are caused to be in an open state. The chip enable buffer circuit 2 has a function of hindering the functions of the first extension chip enable signal /CEm+1 and the second extension chip enable signal CEm+1. The operation of the chip enable buffer circuit 2 of the second embodiment can be the same as that of the chip enable buffer circuit 2 (the circuit in FIG. 5) of the first embodiment. In this case, in an extension address terminal, it is possible to reduce the input terminal capacitance by an amount corresponding to that of two pads. In other words, although being effective when the chip enable signal is demanded to have a high-speed property, in this case, it is preferable for the first and the second option pads to be in an open state.

Third Embodiment

Figure 10:
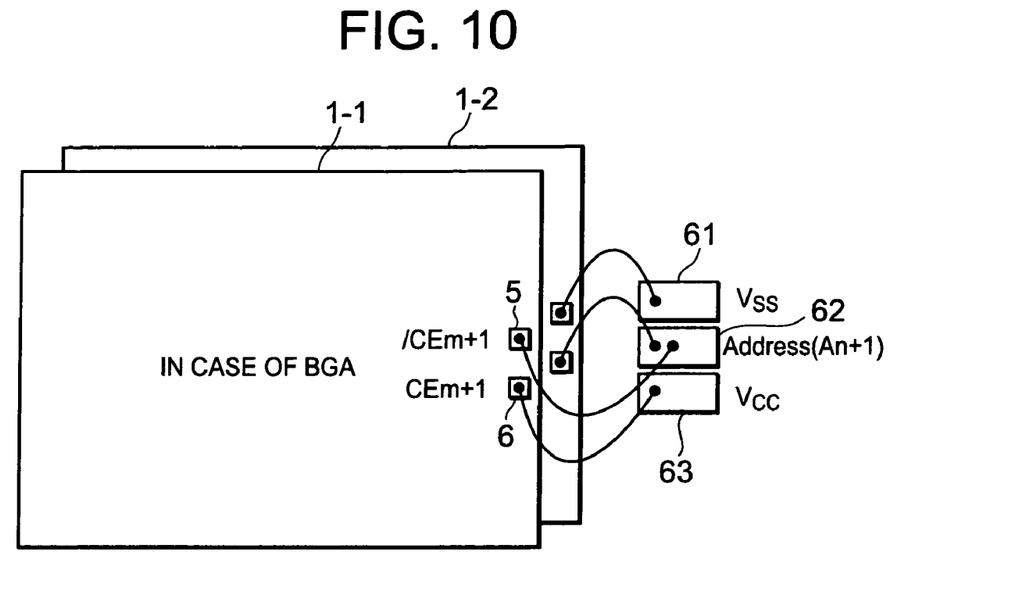
FIG. 10 is a block diagram exemplifying a bonding connection when semiconductor chips 1 are stacked and mounted in a BGA.

Hereinafter, with reference to a drawing, a third embodiment of the present invention will be described. In the third embodiment, a case in which a package mounting a semiconductor chip 1 is a BGA (Ball Grid Array), is exemplified. FIG. 10 is a block diagram exemplifying the bonding connection when the semiconductor chips 1 are stacked and mounted in the BGA. In the case of the BGA, it is possible to cause the stitch for bonding at the side of a substrate to locate at arbitrary positions by means of wiring of the substrate. Therefore, it is possible to arrange the pads of a third stitch 63 which supplies the second power supply voltage VCC and a first stitch 61 which supplies the first power supply voltage VSS, in advance, at positions close to a second stitch 62 which supplies a first extension address An+1. In this case, it is preferable for the semiconductor chip 1 to be constituted with the chip enable buffer circuit 2 of the second embodiment. Application of the chip enable buffer circuit 2 of the second embodiment causes the pad of the first option signal OP1 and the second option signal OP2 to be unnecessary. Moreover, if necessity, pads of the first extension chip enable signal /CEm+1 and the second extension chip enable signal CEm+1 (a first extension chip enable pad 5 and a second extension chip enable pad 6) are connected to the second stitch 62. Further, to pads to which the first extension address An+1 is not supplied, the first stitch 61 which supplies the first power supply voltage VSS, or the third stitch 63 which supplies the second power supply voltage VCC, may be selectively bonded.

Fourth Embodiment

Figure 11:
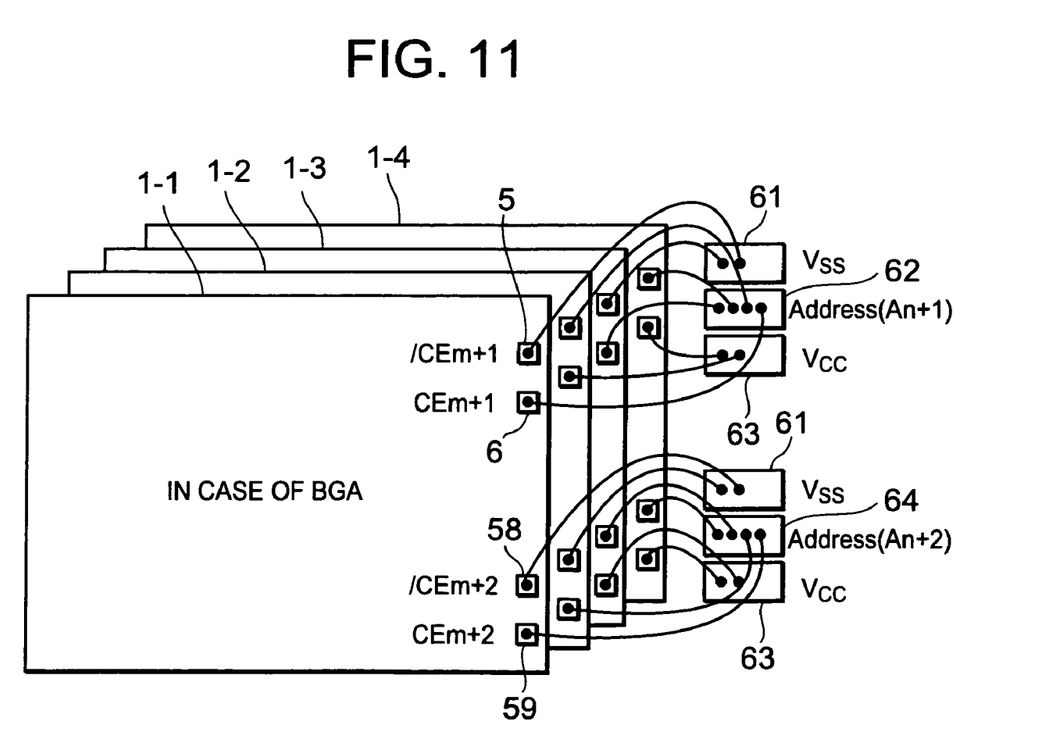
FIG. 11 is a block diagram exemplifying a configuration when four semiconductor chips are stacked.

Hereinafter, with reference to a drawing, a fourth embodiment of the present invention will be described. With regard to the semiconductor chip 1 in the above mentioned embodiments, it is also possible to achieve a package compatible semiconductor memory device with more larger storage capacity by stacking three or more memory chips. In the fourth embodiment, a case in which four semiconductor chips 1 are stacked to constitute a semiconductor memory device with four times storage capacity, is exemplified. FIG. 11 is a block diagram exemplifying the bonding connection when four semiconductor chips 1 (a first semiconductor chip 1-1 to a fourth semiconductor chip 1-4) are stacked. FIG. 11 exemplifies the configuration addressing to a BGA package. As mentioned above, in the case of the BGA package, a plurality of the semiconductor chips 1 can be mounted, without constituting an option pad. When being mounted on a QFP package, a plurality of the semiconductor chips 1 can be mounted thereon by constituting an option pad as mentioned above for every chip enable buffer circuit.

In the semiconductor memory device of the fourth embodiment, inner leads (the second stitch 62, the fourth stitch 64) corresponding to two extension addresses (the first extension address An+1 and the second extension address An+2) are constituted. Moreover, a chip enable buffer circuit which operates in response to two pairs of positive/negative extension chip enable signals (/CEm+1, CEm+1, /CEm+2, CEm+2), is constituted in each of a plurality of the semiconductor chips 1 (the first semiconductor chip 1-1 to the fourth semiconductor chip 1-4).

Conditions that each of the chips is selected, are as follows:
The fourth semiconductor chip 1-4
The first extension address An+1=Low level
The second extension address An+2=Low level
The third semiconductor chip 1-3
The first extension address An+1=High level
The second extension address An+2=Low level
The second semiconductor chip 1-2
The first extension address An+1=Low level
The second extension address An+2=High level
The first semiconductor chip 1-1
The first extension address An+1=High level
The second extension address An+2=High level As mentioned above, by increasing the number of the positive/negative chip enable buffers to be added, further extension of the memory capacity can also be addressed. In addition, the above mentioned embodiments can be embodied in combination of them, unless inconsistency occurs in their configurations and operations.

What is claimed is:

1. A semiconductor chip comprising:
a chip enable buffer circuit which outputs a chip enable signal in response to an output command of the chip enable signal;
a standard chip enable pad which receives said output command;
a first extension pad which supplies a first extension chip enable signal to said chip enable buffer circuit;
a second extension pad which supplies a second extension chip enable signal to said chip enable buffer circuit;
a first option pad which receives a first option signal; and
a second option pad which receives a second option signal,
wherein said chip enable buffer outputs said chip enable signal in response to signals selectively inputted said standard chip enable pad, one of said external pads and one of optional pads.

2. The semiconductor chip according to claim 1,
wherein said chip enable buffer circuit comprises:
a first selection signal generation section which outputs a first selection signal, based on said first option signal, said first extension chip enable signal, and said output command;
a second selection signal generation section which outputs a second selection signal, based on said second option signal, said second extension chip enable signal, and said output command; and
a chip enable signal generation section which generates said chip enable signal, based on said first selection signal, said second selection signal, and said output command.

3. The semiconductor chip according to claim 2, wherein
when said first extension chip enable signal is supplied to said first selection signal generation section and said second option signal is supplied to said second selection signal generation section, said chip enable buffer circuit outputs said chip enable signal in response to said output command, and
when said first option signal is supplied to said first selection signal generation section, and said first extension chip enable signal is supplied to said second selection signal generation section, said chip enable buffer circuit inhibits output of said chip enable signal.

4. The semiconductor chip according to claim 3, further comprising:
a VSS pad which receives a first power supply voltage; and
a VCC pad which receives a second power supply voltage,
wherein
said first option pad is arranged at a position neighboring to said VSS pad or said VCC pad; and
said second option pad is arranged at a position neighboring to said VSS pad or said VCC pad.

5. The semiconductor chip according to claim 3,
wherein
said first extension pad and the said second extension pad are arranged at positions where bonding connection is feasible to a signal line which supplies said first extension chip enable signal or the said second extension chip enable signal.

6. The semiconductor chip according to claim 3,
wherein
said first selection signal generation section includes,
a first logic circuit which outputs said first selection signal, and
a first node which short-circuits between said first extension pad and said first option pad;
said first logic circuit outputs said first selection signal based on a signal supplied through said first node and said output command;
said second selection signal generation section includes,
a second logic circuit which outputs said second selection signal, and
a second node which short-circuits between said second extension pad and said second option pad; and
said second logic circuit outputs said second selection signal based on a signal supplied through said second node and said output command.

7. The semiconductor chip according to any one of claim 3,
wherein
said first selection signal includes,
a reversed first option signal and a first logic circuit output signal;
said first selection signal generation section includes,
a first reverse element which outputs said reversed first option signal, and
a first logic circuit which outputs said first logic circuit output signal;
said first logic circuit outputs said first logic circuit output signal, based on said reversed first option signal, said first extension chip enable signal, and said output command;
said second selection signal includes,
a reversed second option signal and a second logic circuit output signal;
said second selection signal generation section includes,
a second reverse element which outputs said reversed second option signal, and
a second logic circuit which outputs said second logic circuit output signal;
said second logic circuit outputs said first logic circuit output signal, based on said reversed second option signal, said second extension chip enable signal, and said output command; and
said chip enable signal generation section generates said chip enable signal, based on said reversed first option signal, said first logic circuit output signal, said reversed second option signal, said second logic circuit output signal, and said output command.

8. An IC package comprising:
a first semiconductor chip in which the operational state and the standby state thereof are switched in response to a chip enable signal;
a second semiconductor chip in which the operational state and the standby state thereof are switched in response to said chip enable signal;
a standard chip enable lead which supplies an output command to output said chip enable signal; and
an extension address lead which supplies an extension chip enable signal;
wherein
each of said first semiconductor chip and said second semiconductor chip includes,
a standard chip enable pad which receives said output command,
a first extension pad which supplies a first extension chip enable signal to a chip enable buffer circuit,
a second extension pad which supplies a second extension chip enable signal to said chip enable buffer circuit, a first option pad which receives a first option signal, and a second option pad which receives a second option signal;

said extension address lead is connected to said first extension pad of said first semiconductor chip and said second extension pad of said second semiconductor chip; and said standard chip enable lead is connected to said standard chip enable pad of said first semiconductor chip and said standard chip enable pad of said second semiconductor chip.

9. The IC package according to claim 8, further comprising:

a VSS lead which supplies a first power supply voltage; and
a VCC lead which supplies a second power supply voltage;
wherein
said VSS lead is connected to said first option pad of said second semiconductor chip; and
said VCC lead is connected to said second option pad of said first semiconductor chip.

10. An IC package comprising:

a semiconductor chip including a chip enable buffer circuit which outputs a chip enable signal, in which the operational state and the standby state thereof are switched in response to said chip enable signal; and an extension address lead which supplies an extension chip enable signal to said semiconductor chip;

wherein when a plurality of said semiconductor chips are mounted on the package, said extension address lead is connected to said plurality of said semiconductor chips; and when single semiconductor chip is mounted on the package, said extension address lead inhibits supplying said extension chip enable signal.

11. A semiconductor chip comprising:

a first chip enable pad into which an external chip enable signal is input;

a second chip enable pad and a third chip enable pad into any one of which an external address signal is input; and a chip enable circuit which supplies an internal chip enable signal according to a logic level of said external chip enable signal and according to whether said external address signal is input to either one of said second and third pads, wherein said third chip enable pad receives a first power supply voltage when said second chip enable pad receives an address signal, and wherein said second chip enable pad receives a second power supply voltage different from said first power supply voltage when said third chip enable pad receives said address signal.

12. The semiconductor chip according to claim 11, further comprising, a first option pad,
wherein
said first supply power voltage is supplied therein through said first option pad.

13. The semiconductor chip according to claim 11, further comprising, a second option pad,
wherein
said second supply power voltage is supplied therein through said second option pad.

14. The semiconductor chip according to claim 12,
wherein
said first option pad is arranged so as to be close to a first power supply pad to which said first power supply voltage is supplied.

15. The semiconductor chip according to claim 13,
wherein
said second option pad is arranged so as to be close to a second power supply pad to which said second power supply voltage is supplied.

16. A multi-chip package,
wherein
at least two of the semiconductor chips according to claim 11 are stacked and mounted on one package by using them as an upper chip and a lower chip;

to a first to third chip enable pads of said upper chip, a chip enable signal, an address signal, and a first power supply voltage are input, respectively; and to a first to third chip enable pads of said lower chip, a chip enable signal, a second power supply voltage, and an address signal are input, respectively.

17. The multi-chip package according to claim 16, further comprising:

a first inner lead which supplies said address signal to the second chip enable pad of said upper chip and said third chip enable pad of said lower chip; and second and third inner leads which supply said first and second power supply voltages being different from each other to said third chip enable pad of said upper chip and said second chip enable pad of said lower chip, respectively;

wherein said first inner lead is interposed between said second and third inner leads.

18. The semiconductor chip according to claim 4,
wherein
said first selection signal generation section includes,
a first logic circuit which outputs said first selection signal, and
a first node which short-circuits between said first extension pad and said first option pad;
said first logic circuit outputs said first selection signal based on a signal supplied through said first node and said output command;
said second selection signal generation section includes,
a second logic circuit which outputs said second selection signal, and
a second node which short-circuits between said second extension pad and said second option pad; and
said second logic circuit outputs said second selection signal based on a signal supplied through said second node and said output command.

19. The semiconductor chip according to claim 5,
wherein
said first selection signal generation section includes,
a first logic circuit which outputs said first selection signal, and
a first node which short-circuits between said first extension pad and said first option pad;
said first logic circuit outputs said first selection signal based on a signal supplied through said first node and said output command;
said second selection signal generation section includes,
a second logic circuit which outputs said second selection signal, and
a second node which short-circuits between said second extension pad and said second option pad; and
said second logic circuit outputs said second selection signal based on a signal supplied through said second node and said output command.

* * * * *